(12) United States Patent
Wang et al.

(10) Patent No.: US 11,744,130 B2
(45) Date of Patent: Aug. 29, 2023

(54) DISPLAY SUBSTRATE AND PREPARATION METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yunhao Wang, Beijing (CN); Can Huang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 262 days.

(21) Appl. No.: 17/327,800

(22) Filed: May 24, 2021

(65) Prior Publication Data
US 2022/0130906 A1    Apr. 28, 2022

(30) Foreign Application Priority Data
Oct. 23, 2020   (CN) .......................... 202011145176.8

(51) Int. Cl.
| | | |
|---|---|---|
| H10K 59/38 | (2023.01) | |
| H10K 59/40 | (2023.01) | |
| G06F 3/041 | (2006.01) | |
| H10K 50/84 | (2023.01) | |
| H10K 59/122 | (2023.01) | |
| H10K 71/00 | (2023.01) | |
| H10K 59/12 | (2023.01) | |

(52) U.S. Cl.
CPC ........... *H10K 59/38* (2023.02); *G06F 3/0412* (2013.01); *H10K 50/84* (2023.02); *H10K 59/122* (2023.02); *H10K 59/40* (2023.02); *H10K 71/00* (2023.02); *H10K 59/1201* (2023.02)

(58) Field of Classification Search
CPC ...... H10K 59/38; H10K 50/84; H10K 59/122; H10K 59/40; H10K 71/00; H10K 59/1201; H10K 59/12; G06F 3/0412; G06F 3/044; G06F 3/0445
See application file for complete search history.

(56) References Cited

U.S. PATENT DOCUMENTS

2014/0184940 A1*   7/2014   Ma ........................ G06F 3/0446
                                                                    445/24

\* cited by examiner

*Primary Examiner* — Kyoung Lee
(74) *Attorney, Agent, or Firm* — Ling Wu; Stephen Yang; Ling and Yang Intellectual Property

(57) ABSTRACT

A display substrate, a preparation method thereof and a display apparatus. The display substrate comprises a substrate, multiple pixel units arranged on the substrate and a color filter layer arranged on the pixel unit, wherein the color filter layer comprises color optical filters of different colors and a touch control structure layer arranged between the color optical filters of different colors; the touch control structure layer comprises a touch control connection electrode, a first coating protective layer covering the touch control connection electrode and a touch control electrode arranged on the first coating protective layer, the touch control electrodes comprise a first touch control electrode and a second touch control electrode, and at least one of the first touch control electrode and the second touch control electrode is connected with the touch control connection electrode through a via hole penetrating through the first coating protective layer.

20 Claims, 7 Drawing Sheets

DISPLAY SUBSTRATE AND PREPARATION METHOD THEREOF, AND DISPLAY APPARATUS

CROSS-REFERENCE TO RELATED APPLICATION

The present application claims the priority of Chinese Patent Application No. 202011145176.8 filed to the CNIPA on Oct. 23, 2020, the content of which is hereby incorporated by reference.

TECHNICAL FIELD

The present disclosure relates to, but is not limited to, the field of display technology, and particularly relates to a display substrate, a preparation method thereof, and a display apparatus.

BACKGROUND

An Organic Light Emitting Diode (OLED) is an active light emitting display device, and has advantages of self-emission, wide view, high contrast, low power consumption, extremely high response speed, etc. With the continuous development of display technology, the OLED technology is increasingly applied in flexible display devices.

The Flexible Multi-Layer On Cell (FMLOC) and CF on Encapsulation (COE) technologies integrate the functions of touch control and optical filter into a whole, forming a multi-functional layer stacked display substrate structure.

SUMMARY

The following is a summary of the subject matter described in detail in the present disclosure. This summary is not intended to limit the protection scope of the claims.

In a first aspect, the present disclosure provides a display substrate, which includes a substrate, multiple pixel units arranged on the substrate, and a color filter layer arranged on the pixel units, wherein the color filter layer includes color optical filters of different colors and a touch control structure layer arranged between the color optical filters of different colors; the touch control structure layer includes a touch control connection electrode, a first coating protective layer covering the touch control connection electrode and a touch control electrode arranged on the first coating protective layer, wherein the touch control electrode includes a first touch control electrode and a second touch control electrode, and at least one of the first touch control electrode and the second touch control electrode is connected with the touch control connection electrode through a via hole penetrating through the first coating protective layer.

In some exemplary embodiments, the touch control electrode includes a first metal layer and a second metal layer arranged on the first metal layer, wherein the orthographic projection of the second metal layer on the substrate coincides with the orthographic projection of the first metal layer on the substrate.

In some exemplary embodiments, the touch control electrode further includes a third metal layer, wherein the first metal layer is arranged on the third metal layer, and the construction material of the third metal layer includes titanium.

In some exemplary embodiments, the reflectivity of the second metal layer is less than a first reflectivity, and the construction material of the second metal layer includes molybdenum oxide.

In an exemplary embodiment, the first reflectivity is 17%.

In some exemplary embodiments, the thickness of the touch control electrode is 300 nm to 400 nm.

In some exemplary embodiments, the thickness of the second metal layer is 35 nm to 70 nm.

In some possible embodiments, the thickness of the color filter layer is 2 microns to 3 microns.

In some exemplary embodiments, the thickness of the touch control connection electrode is 150 nm to 300 nm.

In some exemplary embodiments, the thickness of the first coating protective layer is 1.5 microns to 2.5 microns.

In some exemplary embodiments, the pixel unit includes multiple sub-pixels, and each sub-pixel includes a driving structure layer, a first planarization layer, a first electrode, a pixel definition layer, an organic light emitting layer, a second electrode, and an encapsulation layer. The driving structure layer is arranged on the substrate, and a driving structure layer in each sub-pixel includes a first thin film transistor.

The first planarization layer is arranged on the driving structure layer.

The first electrode is arranged on the first planarization layer and connected with the first thin film transistor in the driving structure layer through a via hole formed on the first planarization layer.

The pixel definition layer is arranged on the first planarization layer and includes multiple pixel openings, wherein the pixel opening exposes the first electrode.

The organic light emitting layer is arranged on the first electrode.

The second electrode is arranged on the organic light emitting layer.

The encapsulation layer is arranged on the second electrode and covers the whole substrate.

The color filter layer is arranged on the encapsulation layer.

In some exemplary embodiments, the orthographic projection of the touch control structure layer on the substrate is located within the range of the orthographic projection of the pixel definition layer on the substrate.

In some exemplary embodiments, the orthographic projection of the color optical filter on the substrate contains the orthographic projection of the organic light emitting layer on the substrate.

In some exemplary embodiments, the driving structure layer includes: a buffer layer, an active layer, a first gate insulating layer, a first gate electrode layer, a second gate insulating layer, a second gate electrode layer, a first interlayer insulating layer and a first source and drain metal layer which are layer stacked arranged on the substrate in turn.

In some exemplary embodiments, the display substrate further includes a second coating protective layer covering the color filter layer and a cover plate arranged above the second coating protective layer.

In some exemplary embodiments, the thickness of the second coating protective layer is 1.5 microns to 2.5 microns.

In a second aspect, the present disclosure also provides a display apparatus, including the above display substrate.

In a third aspect, the present disclosure also provides a preparation method of a display substrate, which includes: forming multiple pixel units on a substrate; forming a color filter layer on the pixel unit, wherein the color filter layer includes color optical filters of different colors and a touch control structure layer arranged between the color optical filters of different colors, the touch control structure layer includes a touch control connection electrode, a first coating protective layer covering the touch control connection electrode and a touch control electrode arranged on the first coating protective layer, wherein the touch control electrode includes a first touch control electrode and a second touch control electrode, and at least one of the first touch control electrode and the second touch control electrode is connected with the touch control connection electrode through a via hole penetrating through the first coating protective layer.

In some exemplary embodiments, forming multiple pixel units on the substrate includes:

forming a driving structure layer on the substrate;

forming a first planarization layer on the driving structure layer;

forming a first electrode and a pixel definition layer on the first planarization layer;

forming an organic light emitting layer on the pixel definition layer;

forming a second electrode on the organic light emitting layer; and forming an encapsulation layer on the second electrode.

In some exemplary embodiments, forming the color filter layer on the pixel unit includes:

forming a touch control connection electrode on the encapsulation layer, wherein an orthographic projection of the touch control connection electrode on the substrate is within a range of an orthographic projection of the pixel definition layer on the substrate;

forming a first coating protective layer covering the touch control connection electrode, and forming a via hole exposing the touch control connection electrode on the first coating protective layer;

forming a touch control electrode on the first coating protective layer, wherein the touch control electrode is connected with the touch control connection electrode layer through a via hole; and forming color optical filters of different colors, wherein the orthographic projection of the color optical filters on the substrate contains the orthographic projection of the organic light emitting layer on the substrate.

Other aspects will become apparent upon reading and understanding accompanying drawings and the detailed description.

BRIEF DESCRIPTION OF DRAWINGS

The attached drawings are for providing a further understanding of the technical scheme of the present disclosure and constitute a part of the description. They are for explaining the technical scheme of the present disclosure together with the embodiments of the present application and do not constitute a limitation on the technical scheme of the present disclosure. Shapes and sizes of the components in the drawings do not reflect true proportions and only to be used to schematically illustrate contents of the present disclosure.

DETAILED DESCRIPTION

Specific implementations of the present disclosure will be described in detail below with reference to the accompanying drawings and embodiments. The following embodiments serve to illustrate the present disclosure, but are not intended to limit the scope of the present disclosure. The embodiments and features in the embodiments in the present disclosure may be combined randomly if there is no conflict.

A display substrate structure has problems such as complex process, high cost, small brightness attenuation angle and so on.

The embodiment of the disclosure provides a display substrate, which includes a substrate, multiple pixel units arranged on the substrate and a color filter layer arranged on the pixel unit, wherein the color filter layer includes color optical filters of different colors and a touch control structure layer arranged between the color optical filters of different colors; the touch control structure layer includes a touch control connection electrode, a first coating protective layer covering the touch control connection electrode and a touch control electrode arranged on the first coating protective layer, wherein the touch control electrode includes a first touch control electrode and a second touch control electrode, and at least one of the first touch control electrode and the second touch control electrode is connected with the touch control connection electrode through a via hole penetrating through the first coating protective layer.

According to the display substrate provided by the embodiment of the disclosure, a black matrix (BM) Mask process and a protective layer coating process are omitted by arranging the touch control structure layer between color optical filters of different colors, so that the purposes of cost saving and process simplification are achieved, the distance between the organic light emitting layer and the color filter layer is shortened, the thickness of the display substrate is reduced, the brightness decay (L-Decay) angle is effectively increased, the power consumption is reduced, the preparation process is simple, the production efficiency is high, having advantages of low production cost and high yield, etc., and having a good application prospect.

Figure 1:
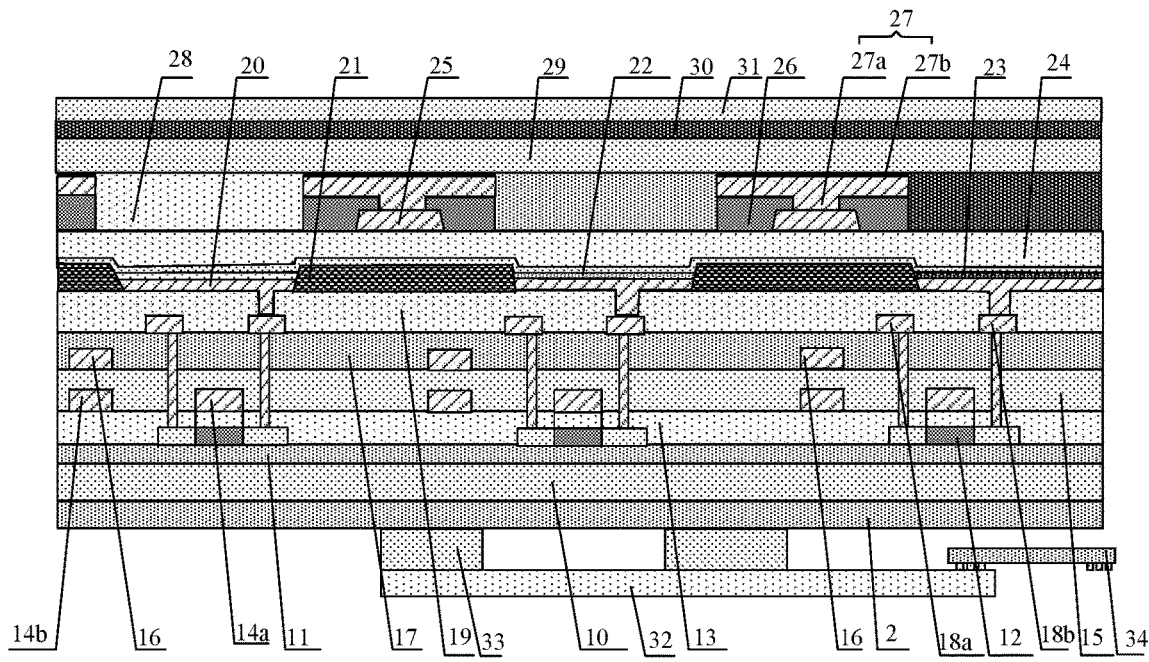
FIG. 1 is a schematic diagram of a structure of a display substrate according to an embodiment of the present disclosure.

FIG. 1 is a schematic diagram of a structure of a display substrate according to an embodiment of the present disclosure. As shown in FIG. 1, the display substrate according to an embodiment of the present disclosure may include: a substrate 10 and multiple pixel units matrix arranged on the substrate 10. Each pixel unit includes multiple sub-pixels. For example, each pixel unit may include three sub-pixels, namely red sub-pixel R, green sub-pixel G and blue sub-pixel B.

The display substrate may further include a color filter layer arranged on the pixel unit. The color filter layer may include color optical filters 28 of different colors and a touch control structure layer arranged between the color optical filters 28 of different colors. The touch control structure layer includes a touch control connection electrode 25, a first coating protective layer 26 covering the touch control connection electrode 25, and a touch control electrode 27 arranged on the first coating protective layer 26. The touch control electrode 27 includes a first touch control electrode and a second touch control electrode, wherein at least one of the first touch control electrode and the second touch control electrode is connected with the touch control connection electrode 25 through a via hole penetrating through the first coating protective layer 26.

Figure 2A:
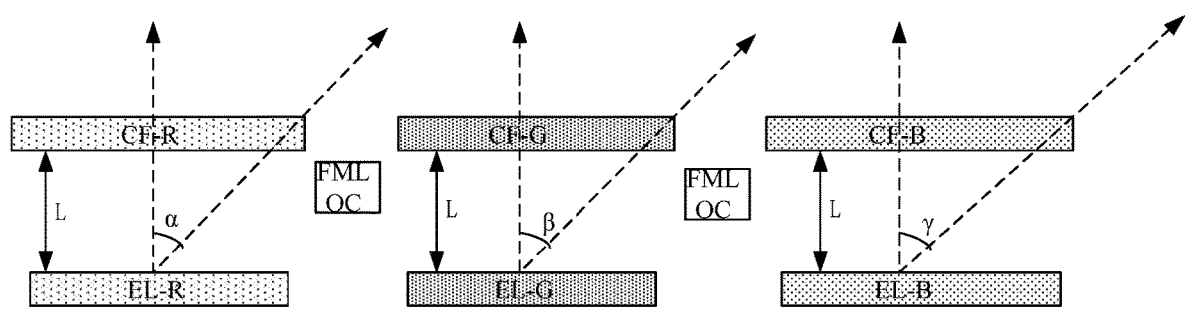
FIG. 2a is a schematic diagram of a light out angel of a display substrate.
Figure 2B:
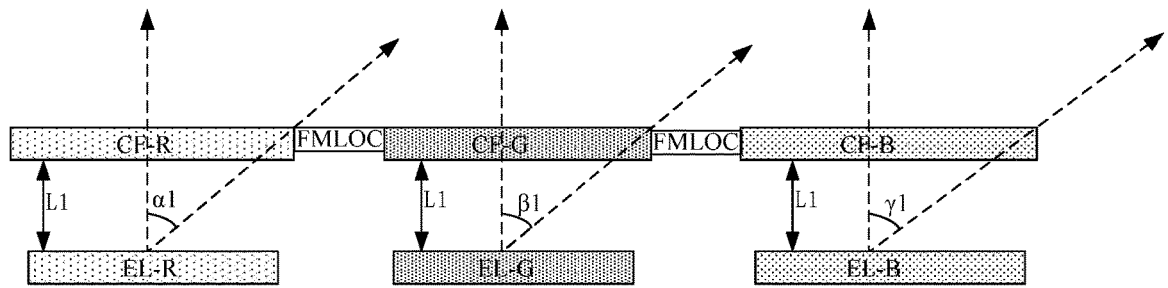
FIG. 2b is a schematic diagram of a structure of a light out angel of a display substrate according to an exemplary embodiment.

In this embodiment, by arranging the touch control structure layer between color optical filters of different colors, the distance between the organic light emitting layer and the color filter layer is shortened (in an exemplary embodiment, the distance is shortened by about 18%), and the thickness of the display substrate is reduced (in an exemplary embodiment, the thickness is reduced by about 56%). As shown in FIG. 2a to FIG. 2b and table 1, FIG. 2a shows a schematic diagram of the light out angle of structure I, wherein structure I refers to a display substrate with the touch control structure layer arranged between the organic light emitting layer and the color filter layer. Under the condition of color optical filters of the same width, compared with structure I, the display substrate of this embodiment increases the light out angle of the organic light emitting layer, that is, the light decay L-Decay angle is increased efficiently, the power consumption is reduced, being beneficial to realize the bending function.

TABLE 1

| | Light out angle of structure I | The light out angle of the structure of the present disclosure |
|---|---|---|
| R | α = 42.0° | α 1 = 47.7 (α 1 is increased by 13.6% compared with α) |
| G | β = 53.2° | β 1 = 58.4 (β 1 is increased by 9.8% compared with β) |
| B | γ = 61.4° | γ 1 = 65.9 (γ 1 is increased by 7.3% compared with γ) |

In an exemplary embodiment, as shown in FIG. 1, the touch control electrode 27 may include a first metal layer 27a and a second metal layer 27b arranged on the first metal layer 27a. An orthographic projection of the second metal layer 27b on the substrate 10 coincides with an orthographic projection of the first metal layer 27a on the substrate 10.

The second metal layer 27b is directly arranged on the first metal layer 27a, so that widths of the first metal layer 27a and the second metal layer 27b may be set as a width of an opening between the color optical filters, and the first metal layer 27a does not reflect light, which increases the width of the touch control electrode 27 and reduces a wiring resistance of the touch control electrode 27.

In an exemplary embodiment, a reflectivity of the second metal layer 27b may be less than a first reflectivity.

In an exemplary embodiment, the first reflectivity may be 17%.

In an exemplary embodiment, a material of the second metal layer 27b may be molybdenum oxide (MoOx) or other materials with a low reflectivity. The thickness of the second metal layer 27b may be 35 nm to 75 nm. The reflectivity of molybdenum oxide (MoOx) in different thickness ranges is shown in table 2.

TABLE 2

| Material | BM | MoOx |
|---|---|---|
| Thickness range | 1.0 μm to 1.5 μm | 35 nm to 75 nm |
| Reflectivity range | 0.074 to 0.057 | 0.173 to 0.039 |

In an exemplary embodiment, MoOx is black under illumination and has a low reflectivity. Setting a surface layer of the touch control electrode 27 as MoOx may reduce a reflectivity of a black matrix (BM) in a CF on Encapsulation (COE).

In an exemplary embodiment, the touch control electrode 27 may further include a third metal layer, a first metal layer arranged on the third metal layer, and a second metal layer arranged on the first metal layer. The third metal layer can protect the first metal layer.

In an exemplary embodiment, a material of the third metal layer may be titanium (Ti).

In an exemplary embodiment, a material of the first metal layer may be aluminum (Al).

In an exemplary embodiment, a material of the second metal layer may be molybdenum oxide (MoOx).

In an exemplary embodiment, the thickness of the touch control electrode 27 may be 300 nm to 400 nm.

In an exemplary embodiment, the thickness of the color filter layer may be 2 microns to 3 microns.

In an exemplary embodiment, the thickness of the touch control connection electrode may be 150 nm to 300 nm.

In an exemplary embodiment, the thickness of the first coating protective layer may be 1.5 microns to 2.5 microns.

In an exemplary embodiment, each sub-pixel includes a driving structure layer, a first planarization layer 19, a first electrode 20, a pixel definition layer 21, an organic light emitting layer 22, a second electrode 23 and an encapsulation layer 24.

The driving structure layer is arranged on the substrate 10, wherein a driving structure layer in each sub-pixel includes a first thin film transistor.

The first planarization layer 19 is arranged on the driving structure layer.

The first electrode 20 is arranged on the first planarization layer 19 and connected with the first thin film transistor in the driving structure layer through a via hole formed in the first planarization layer 19.

The pixel definition layer 21 is arranged on the first planarization layer 19, and includes multiple pixel openings, wherein the pixel opening exposes the first electrode 20.

The organic light emitting layer 22 is arranged on the first electrode 20.

The second electrode 23 is arranged on the organic light emitting layer 22.

The encapsulation layer 24 is arranged on the second electrode layer 23 and covers a whole substrate 10.

The color filter layer is arranged on the encapsulation layer 24.

In an exemplary embodiment, the orthographic projection of the touch control structure layer on the substrate 10 is located within the range of the orthographic projection of the pixel definition layer 21 on the substrate 10.

In an exemplary embodiment, the orthographic projection of the color optical filter 28 on the substrate 10 contains the orthographic projection of the organic light emitting layer 22 on the substrate 10.

In an exemplary embodiment, the display substrate may further include: a second coating protective layer 29 covering the color filter layer and a cover plate 31 arranged above the second coating protective layer 29.

In an exemplary embodiment, the thickness of the second coating protective layer 29 is 1.5 microns to 2.5 microns.

In an exemplary embodiment, as shown in FIG. 1, the driving structure layer may include: a buffer layer 11, an active layer 12, a first insulating layer 13, a first gate electrode layer, a second insulating layer 15, a second gate electrode layer 16, a first interlayer insulating layer 17, and a source and drain metal layer which are layer stacked arranged on the substrate 10 in turn.

The technical scheme of the display substrate according to an exemplary embodiment will be described as following through the preparation process of the display substrate. A "patterning process" mentioned in the embodiment includes processes, such as a film layer deposition, a photoresist coating, a mask exposure, a development, an etching, and a photoresist stripping, etc. A "photoetching process" mentioned in the embodiment includes processes, such as a film layer coating, a mask exposure, and a development, etc. Any one or more selected from sputtering, evaporation and chemical vapor deposition may be used for deposition. Any one or more selected from spray coating and spin coating may be used for coating. Any one or more selected from dry etching and wet etching may be used for etching. A "thin film" refers to a layer of thin film manufactured by deposition or coating of a certain material on a substrate base. If the "thin film" does not need to be subjected to a patterning process during the whole manufacturing process, a "thin film" may also be called a "layer". When the "thin film" needs to be subjected to a patterning process during the whole manufacturing process, a "thin film" is referred to as a "thin film" prior to the patterning process and as a "layer" subsequent to the patterning process. The "layer" subsequent to the patterning process contains at least one "pattern". In the present disclosure, "a and b are arranged on the same layer" means that a and b are formed at the same time by the same patterning process. "An orthographic projection of A contains an orthographic projection of B" means that the orthographic projection of B falls within the scope of the orthographic projection of A, or the orthographic projection of A covers the orthographic projection of B.

(1) A flexible substrate base 10 is prepared on a glass carrier plate 1.

Figure 3:
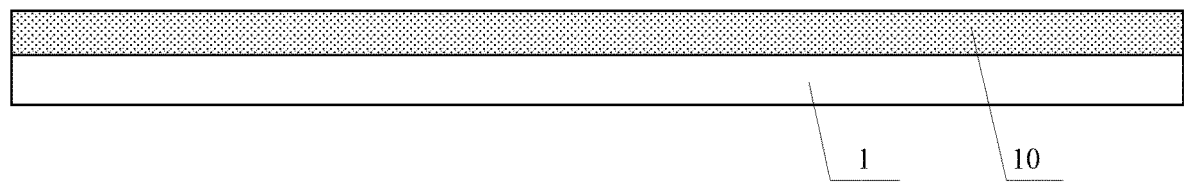
FIG. 3 is a schematic diagram of a display substrate after a pattern of a flexible substrate is prepared according to an exemplary embodiment.

In an exemplary embodiment, a material of the flexible substrate 10 may adopt a material such as polyimide (PI), polyethylene terephthalate (PET), or a surface-treated polymer soft film, etc., as shown in FIG. 3.

(2) A pattern of the driving structure layer is prepared on the flexible substrate 10. The driving structure may include multiple gate lines and multiple data lines. The multiple gate lines and the multiple data lines vertically cross to define multiple sub-pixels which are matrix arranged. Each pixel unit includes at least three sub-pixels, and each sub-pixel includes at least one first Thin Film Transistor (TFT).

In an exemplary embodiment, the first thin film transistor may be of a bottom gate structure or a top gate structure, which is not limited herein.

In an exemplary embodiment, the first thin film transistor may be an Amorphous Silicon (a-Si) thin film transistor, a low-temperature polysilicon (LTPS) thin film transistor or an oxide thin film transistor, which is not limited herein.

In an exemplary embodiment, a pixel unit may include three sub-pixels, a red sub-pixel R, a green sub-pixel G and a blue sub-pixel B respectively. Or a pixel unit may include four sub-pixels, a red sub-pixel R, a green sub-pixel G, a blue sub-pixel B and a white sub-pixel W.

In an exemplary embodiment, the preparation process of the driving structure layer may include: depositing a first insulating thin film and an active layer thin film on the flexible substrate 10 in turn and patterning the active layer thin film through a patterning process to form a first insulating layer 11 covering a whole flexible base 10 and a pattern of an active layer 12 on the first insulating layer 11. The first insulating layer 11 is called a buffer layer, which is configured to improve the water and oxygen resistance of the substrate.

Then, a second insulating thin film and a first metal thin film are deposited in turn, and the first metal thin film is patterned through a patterning process to form a second insulating layer 13 covering the pattern of the active layer 12 and a pattern of a first gate metal layer arranged on the second insulating layer 13, wherein the first gate electrode layer at least include a first gate electrode 14a, a first capacitor electrode 14b, multiple gate lines (not shown) and multiple gate leads (not shown). The second insulating layer 13 is called a first gate insulating (GI1) layer.

Then, a third insulating thin film and a second metal thin film are deposited in turn, and the second metal thin film is patterned through a patterning process to form a third insulating layer 15 covering the first gate electrode layer 14 and a pattern of a second gate electrode layer arranged on the third insulating layer 15, wherein the second gate electrode layer at least include a second capacitor electrode 16 and a second gate lead (not shown), and a position of the second capacitor electrode 16 corresponds to a position of the first capacitor electrode 14b. The third insulating layer 15 is also called a second gate insluting (GI2) layer.

Then, a fourth insulating thin film is deposited and patterned through a patterning process to form a pattern of a fourth insulating layer 17 covering the second gate electrode layer, wherein the fourth insulating layer 17 is provided with multiple first via holes, positions of the multiple first via holes correspond positions of both ends of the first active layer respectively, the fourth insulating layer 17, the third insulating layer 15 and the second insulating layer 13 in the first via hole are etched to expose the surface of the first active layer. The fourth insulating layer 17 is also called a first interlayer insulating (ILD) layer.

Then, a third metal thin film is deposited, the third metal thin film is patterned through a patterning process to form a pattern of a source and drain metal layer on the fourth insulating layer 17, wherein the source and drain metal layer at least include patterns of a first source electrode 18a, a first drain electrode 18b, low voltage (VSS) line (not shown), multiple data lines (not shown) and multiple data leads (not shown), the first source electrode 18a and the first drain electrode 18b are connected through a first via hole and active layer 12. The source and drain metal layer may also include any one or more of a power supply line (VDD), a compensation line and an auxiliary second electrode, and the source and drain metal layer is also called a first source and drain metal layer (SD1).

Figure 4:
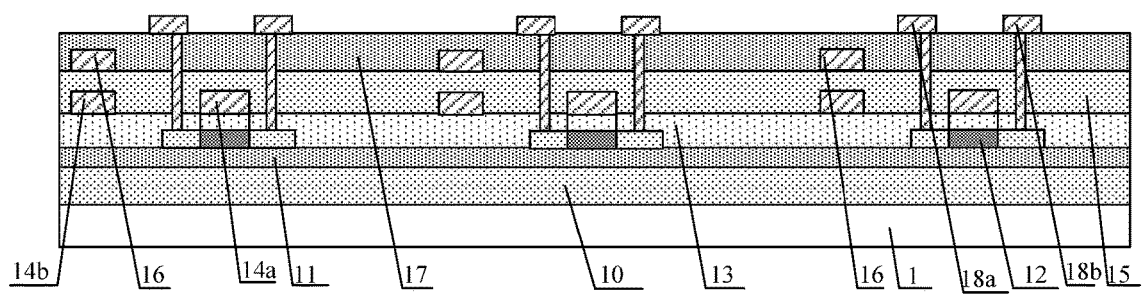
FIG. 4 is a schematic diagram of a display substrate after a pattern of a driving structure layer is prepared according to an exemplary embodiment.

At this point, the driving structure layer pattern is prepared on the flexible substrate 10, which is as shown in FIG. 4. The active layer 12, the first gate electrode 14a, the first source electrode 18a and the first drain electrode 18b constitute a first thin film transistor. The first capacitor electrode 14b and the second capacitor electrode 16b constitute a first storage capacitor. Multiple gate leads and data leads constitute the driving leads of Gate Driver on Array (GOA).

Figure 5:
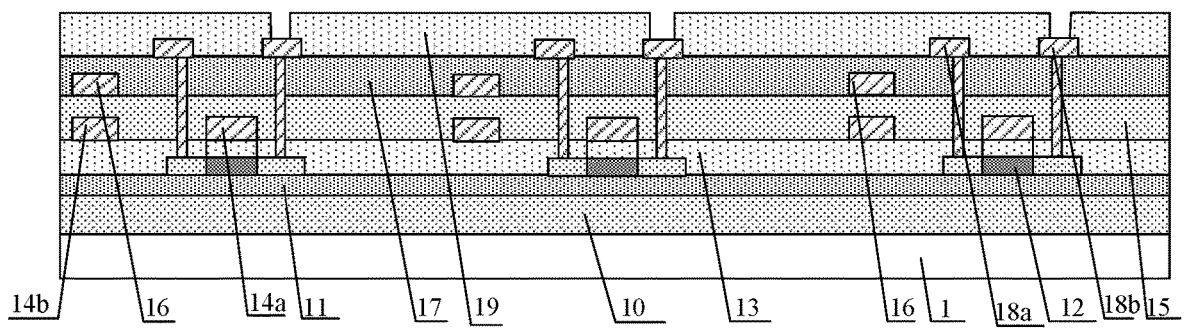
FIG. 5 is a schematic diagram of a display substrate after a pattern of a first planarization layer is formed according to an exemplary embodiment.

(3) A first flat thin film is coated on the flexible substrate on which the aforementioned pattern is formed to form a first planarization (PLN) layer 19 covering a whole flexible substrate 10, a second via hole is formed on the first planarization layer 19 through a patterning process, wherein the first planarization layer 19 in the second via hole is etched away to expose a surface of a first drain electrode of the first thin film transistor, as shown in FIG. 5.

Figure 6:
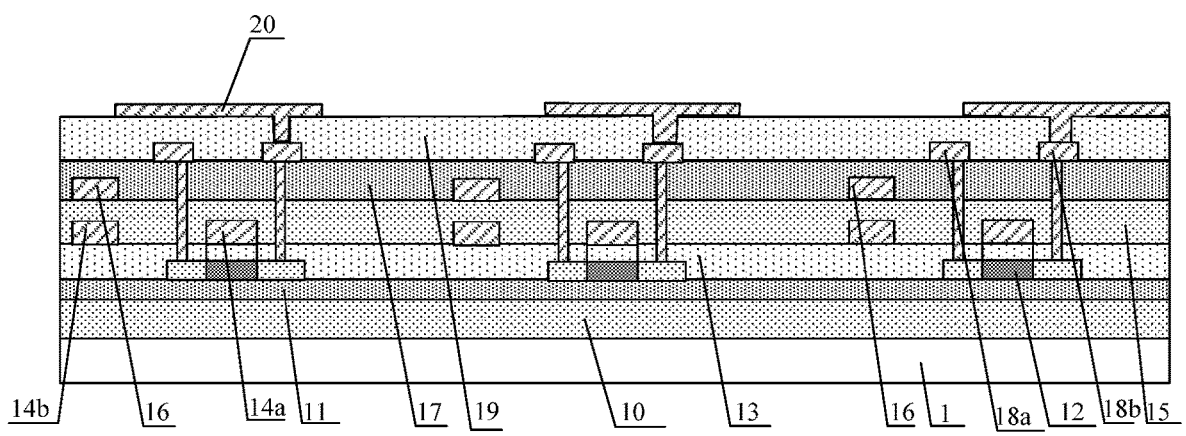
FIG. 6 is a schematic diagram of a display substrate after a pattern of a first electrode is formed according to an exemplary embodiment.

(4) A transparent conductive thin film is deposited on the substrate on which the aforementioned pattern is formed, and the transparent conductive thin film is patterned through a patterning process to form a pattern of a first electrode 20, wherein the first electrode 20 is connected with a first drain electrode D through the second via hole. Forming the pattern of the first electrode 20 includes: depositing a fourth metal thin film on the substrate on which the aforementioned pattern is formed, coating a layer of photoresist on the fourth metal thin film, exposing the photoresist with a single tone mask, forming an unexposed area at a position where the first electrode 20 is located, forming a completely exposed area at other positions, developing and removing the photoresist at the completely exposed area, then etching the fourth metal thin film at the completely exposed area and stripping the remaining photoresist to form the pattern of the first electrode 20, as shown in FIG. 6. Since the display substrate of this embodiment is a top emission structure, the first electrode 20 is a reflective electrode and may adopt metals with high reflectivity, such as silver Ag, gold Au, palladium Pd, platinum Pt, etc., or alloys of these metals, or composite layers of these metals. In practice, a composite layer structure of indium tin oxide ITO layer and metal reflective layer may also be adopted, which has good conductivity, high reflectivity and good morphological stability.

Figure 7:
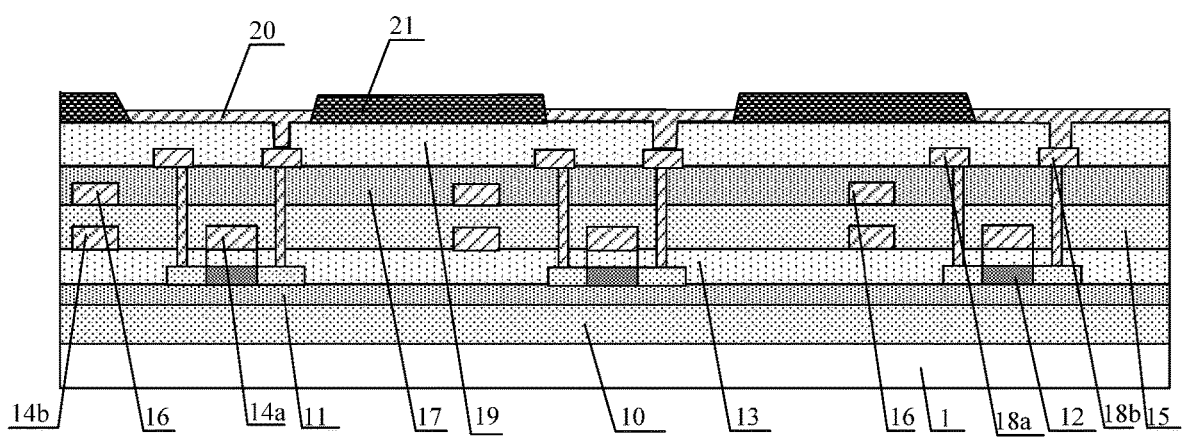
FIG. 7 is a schematic diagram of a display substrate after a pattern of a pixel definition layer is formed according to an exemplary embodiment.

(5) A pixel definition thin film is coated on the substrate on which the aforementioned pattern is formed, and a pattern of a pixel definition layer (PDL) 21 is formed through masking, exposure and development processes, wherein the pixel definition layer 21 is provided thereon with a pixel opening, and a pixel definition thin film within the pixel opening is developed away to expose a surface of the first electrode 20. The pixel definition layer 21 is provided thereon with a first opening, wherein a pixel definition thin film in the pixel opening is developed away to expose a surface of the first planarization layer 19, as shown in FIG. 7.

Figure 8:
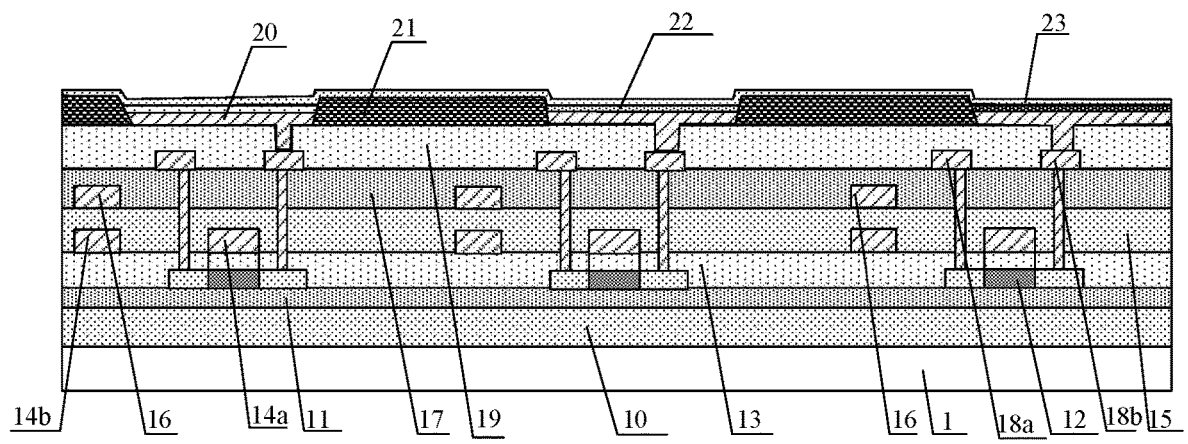
FIG. 8 is a schematic diagram of a display substrate after a pattern of a second electrode is formed according to an exemplary embodiment.

(6) An organic light emitting layer 22 and a second electrode 23 are formed in turn on the substrate on which the aforementioned pattern is formed, as shown in FIG. 8. The organic light emitting layer 22 includes a hole injection layer, a hole transmission layer, a light emitting layer, an electron transporting layer and an electron injection layer which are stacked arranged, to realize that the organic light emitting layer 22 and the first electrode 20 are connected within the pixel opening. Since the first 20 is connected with the first drain electrode D of the first transistor, light emission control of the organic light emitting layer 22 is achieved. The second electrode 23 is connected with the organic light emitting layer 22.

Figure 9:
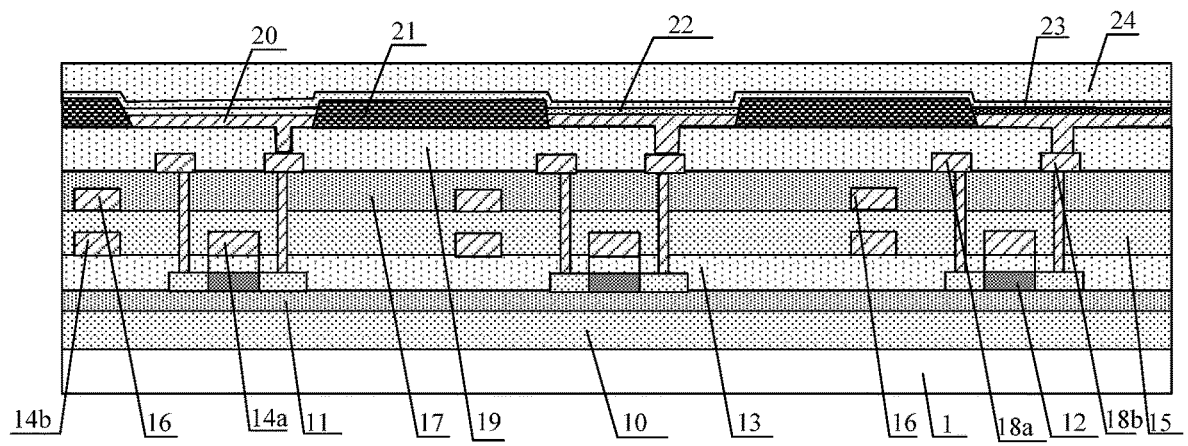
FIG. 9 is a schematic diagram of a display substrate after a pattern of an encapsulation layer is formed according to an exemplary embodiment.

(7) A pattern of the encapsulation layer 24 is formed on the substrate on which the aforementioned pattern is formed. As shown in FIG. 9, the encapsulation layer 24 may adopt a stacked structure of inorganic material/organic material/inorganic material, and the organic material layer is arranged between the two inorganic material layers.

Figure 10:
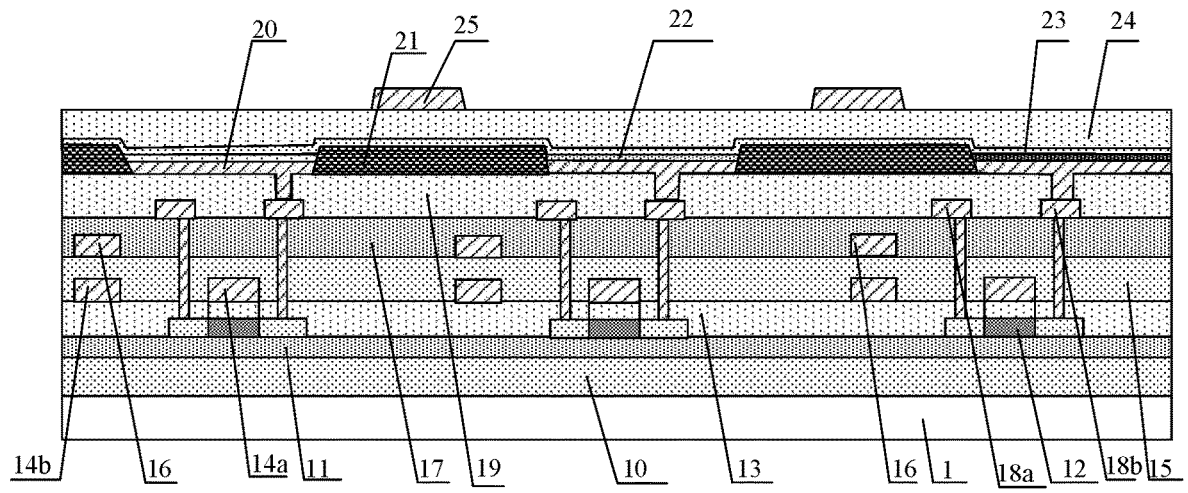
FIG. 10 is a schematic diagram of a display substrate after a pattern of a touch control electrode is formed according to an exemplary embodiment.

(8) A pattern of the touch control connection electrode 25 is formed on the substrate on which the aforementioned pattern is formed. As shown in FIG. 10, the orthographic projection of the touch control connection electrode 25 on the substrate is within a range the orthographic projection of the pixel definition layer 21 on the substrate. The thickness of the touch control connection electrode is about 150 nm to 300 nm.

Figure 11:
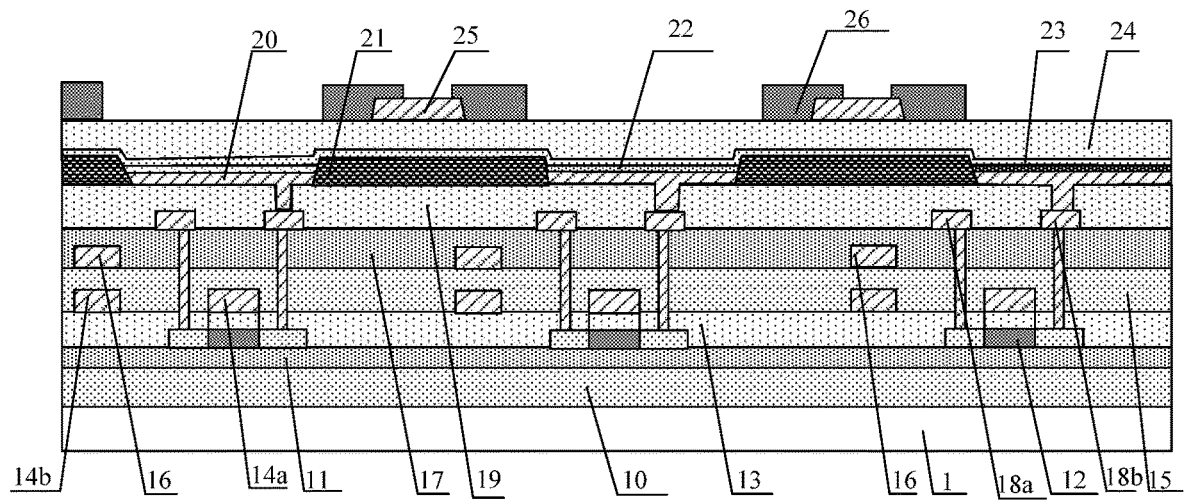
FIG. 11 is a schematic diagram of display substrate after a pattern of a first coating protective layer is formed according to an exemplary embodiment.

(9) A pattern of the first coating protective layer 26 is formed on the substrate on which the aforementioned pattern is formed. As shown in FIG. 11, the first coating protective layer 26 is provided with multiple via holes, wherein the via hole exposes a surface of the touch control connection electrode 25. The thickness of the first coating protective layer 26 is about 1.5 microns to 2.5 microns.

Figure 12:
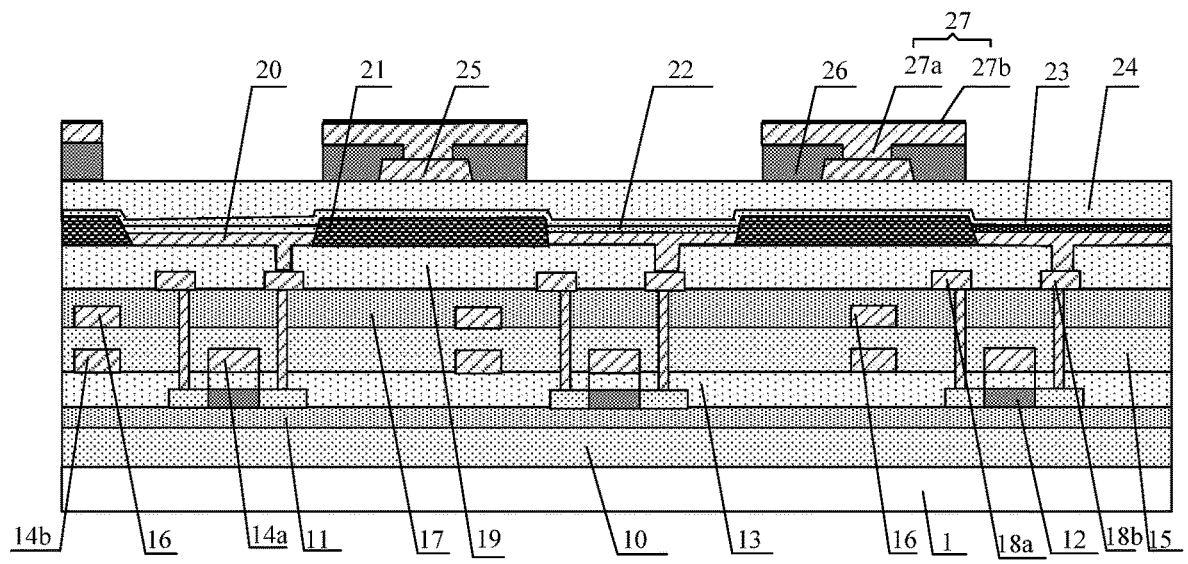
FIG. 12 is a schematic diagram of a display substrate after a pattern of a touch control electrode is formed according to an exemplary embodiment.

(10) A pattern of the touch control electrode 27 is formed on the substrate on which the aforementioned pattern is formed. As shown in FIG. 12, the thickness of the touch control electrode 27 is about 3000 Amy to 4000 Amy, wherein the touch control electrode 27 may be made of multilayer metal of Ti/Al/MoOx, the thickness of MoOx is about 35 nm to 70 nm. In addition, because a surface layer MoOx of the touch control electrode 27 is black under illumination and has low reflectivity, the surface layer MoOx may play a reflectivity reduction role of a black matrix in a color resistance structure.

Figure 13:
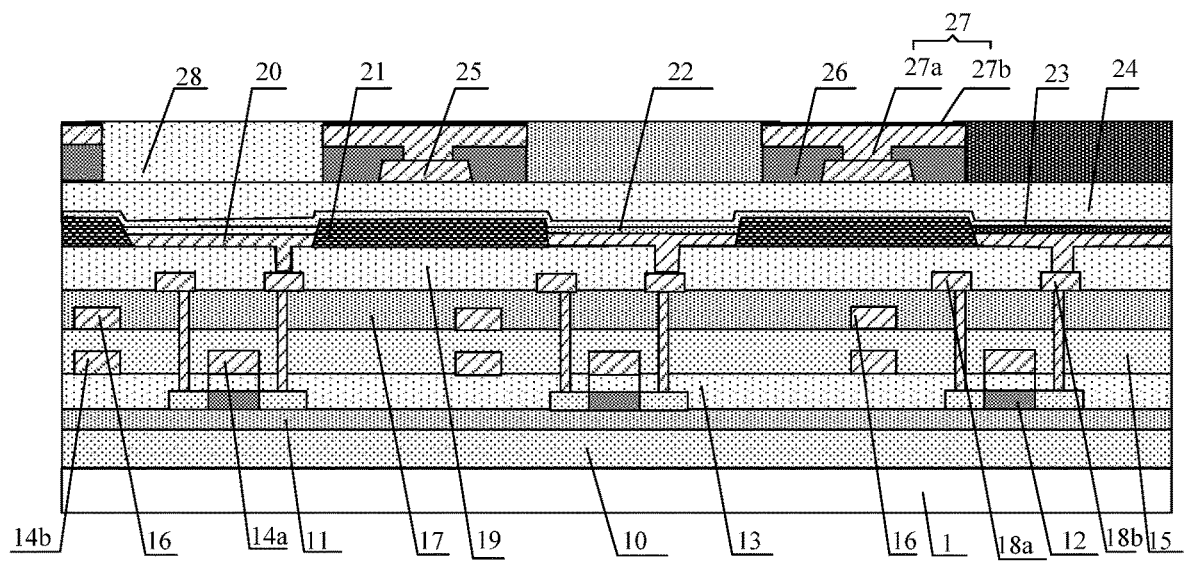
FIG. 13 is a schematic diagram of a display substrate after a pattern of a color optical filter is formed according to an exemplary embodiment.

(11) Patterns of color optical filters 28 of different colors are formed on the substrate on which the aforementioned pattern is formed, as shown in FIG. 13. Forming the pattern of the color optical filter layer includes: coating a polymer photoresist layer mixed with red pigment on the encapsulation layer 24, exposing and developing to form a pattern of a red area; using the same method and steps to form a pattern of a green area and a pattern of a blue area in turn, and forming a color optical filters 28 of red, green and blue arranged according to certain rules. The thickness of the color optical filter 28 is about 2 microns to 3 microns.

Figure 14:
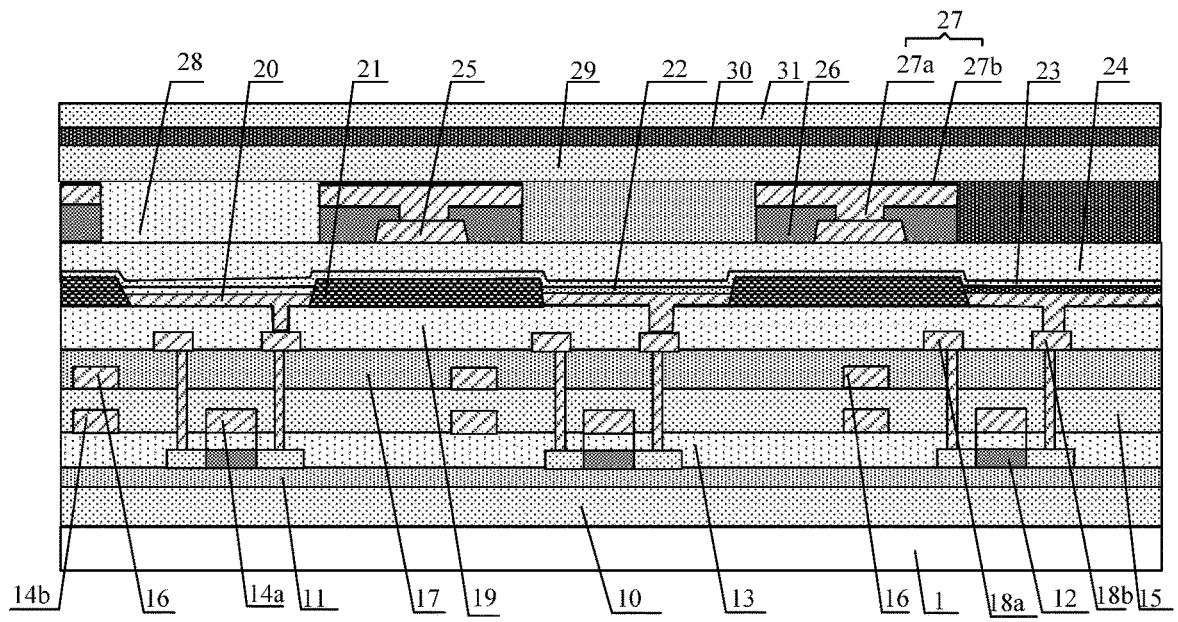
FIG. 14 is a schematic diagram of a display substrate after a cover plate is attach according to an exemplary embodiment.

(12) A thin film encapsulation process is performed on the substrate on which the aforementioned pattern is formed to form a pattern of a second coating protective layer 29; an optical glue 30 is coated on the substrate on which the pattern of the second coating protective layer 29 is formed, and a cover plate 31 is attach to the optical glue 30, as shown in FIG. 14. The thickness of the second coating protective layer is about 1.5 microns to 2.5 microns.

(13) After the above film layer structure is prepared, the display substrate is peeled off from the glass carrier board 1 by a peeling process, and then a layer of base film 2 is attached to the back of the display substrate (a surface of the flexible substrate 10 on a side away from the film layer) by using roller attaching, a fingerprint identification sensor 32 is attached to a surface of the base film 2 on a side away from the flexible substrate 10 through a foam layer 33, wherein the fingerprint identification sensor 32 is connected with the flexible printed circuit (FPC) 34, as shown in FIG. 1.

Through the above processes, the preparation of the display substrate shown in FIG. 1 is completed. It can be seen from the above preparation process that the display substrate provided by this embodiment omits a BM Mask process and a protective layer coating process by arranging the touch control structure layer between color optical filters of different colors, thereby achieving the purposes of saving costs and simplifying processes, shortening the distance between the organic light emitting layer and the color filter layer, reducing the thickness of the display substrate, effectively increasing the brightness attenuation angle, and reducing power consumption. The preparation process is simple, the production efficiency is high, having the advantages low production cost and high yield and the like, and having a good application prospect.

Although the display substrate of this embodiment is described as a top emission structure, the scheme of this embodiment is also applicable to a bottom emission structure or a double-sided emission structure, and is also applicable to large-sized or small-sized display substrates. As shown in FIG. 1, a display substrate prepared through above preparation process includes: a substrate 10, a driving structure layer, a first planarization layer 19, a light emitting structure layer, an encapsulation layer 24, a color filter layer, a second coating protective layer 29, a cover plate 31, a base film 2, and a fingerprint identification sensor 32.

The driving structure layer is arranged on the substrate 10, and a driving structure layer in each sub-pixel includes a first thin film transistor.

The first planarization layer 19 is arranged on the driving structure layer.

The light emitting structure layer is arranged on the first planarization layer 19, a light emitting structure layer in each sub-pixel includes a first electrode 20, a pixel definition layer 21, an organic light emitting layer 22 and a second electrode 23, the first electrode 20 is arranged on the first planarization layer 19 and connected with the first thin film transistor in the driving structure layer through a via hole formed in the first planarization layer 19, the pixel definition layer 21 is arranged on the first planarization layer 19 and includes multiple pixel openings, the pixel opening exposes the first electrode, the organic light emitting layer 22 is arranged on the first electrode 20, and the second electrode 23 is arranged on the organic light emitting layer 22.

The encapsulation layer 24 is arranged on the second electrode layer 23, wherein the encapsulation layer 24 covers a whole display substrate.

The color filter layer is arranged on the encapsulation layer 24, color filter layer includes color optical filters 28 of different colors and a touch control structure layer arranged between the color optical filters 28 of different colors, the touch control structure layer includes a touch control connection electrode 25, a first coating protective layer 26 covering the touch control connection electrode 25, and a touch control electrode 27 arranged on the first coating protective layer 26, the touch control electrode 27 includes a first touch control electrode and a second touch control electrode, at least one of the first touch control electrode and the second touch control electrode is connected with the touch control connection electrode 25 through a via hole penetrating the first coating protective layer 26.

The second coating protective layer 29 is arranged on the color filter layer for protecting the color filter layer.

The cover plate 31 is attached to the second coating protective layer 29 through an optical glue 30.

The base film 2 is arranged on a surface of the substrate 10 on a side away from the driving structure layer.

The fingerprint identification sensor 32 is attached to a surface of the base film 2 on a side away from the substrate 10.

Figure 15:
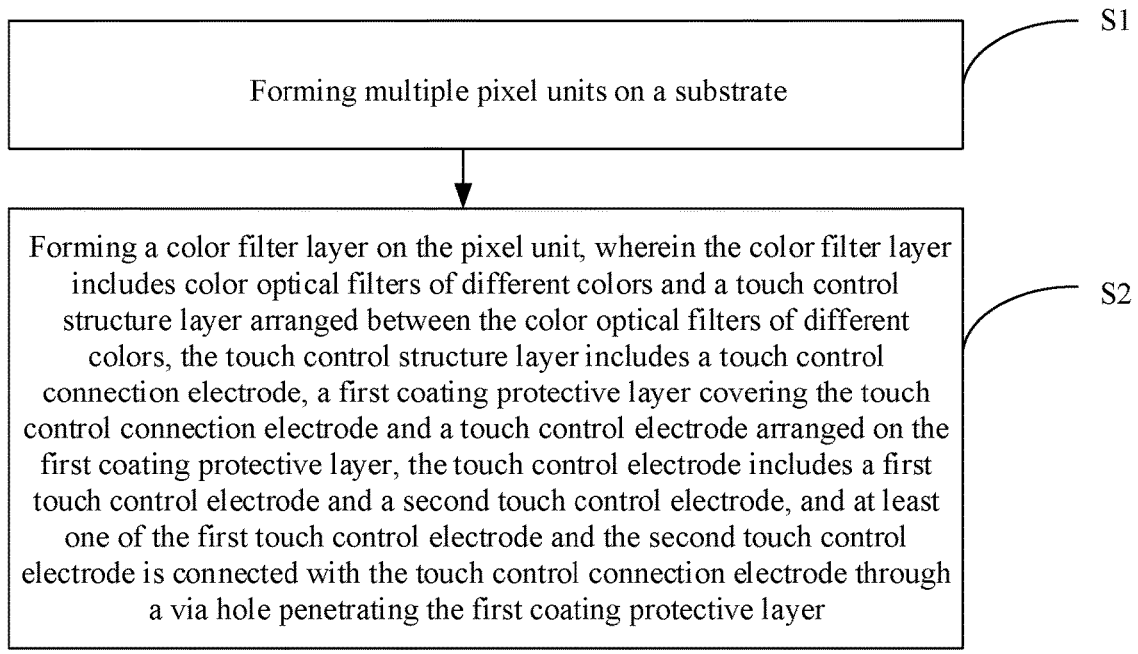
FIG. 15 is a flow schematic diagram of a preparation method of a display substrate according to an exemplary embodiment.

The present disclosure further provides a method for preparing a display substrate. As shown in FIG. 15, a method for preparing a display substrate provided by an embodiment of the present disclosure may include steps S1 and S2.

Step S1 includes forming multiple pixel units on the substrate.

Step S2 includes forming a color filter layer on the pixel unit, wherein the color filter layer includes color optical filters of different colors and a touch control structure layer arranged between the color optical filters of different colors, the touch control structure layer includes a touch control connection electrode, a first coating protective layer covering the touch control connection electrode and a touch control electrode arranged on the first coating protective layer, the touch control electrode includes a first touch control electrode and a second touch control electrode, and at least one of the first touch control electrode and the second touch control electrode is connected with the touch control connection electrode through a via hole penetrating the first coating protective layer.

In an exemplary embodiment, forming the multiple pixel units on the substrate includes:

forming a driving structure layer on the substrate;

forming a first insulating film on a first planarization layer on the driving structure layer;

forming a first electrode and a pixel definition layer on the first planarization layer;

forming an organic light emitting layer on the pixel definition layer;

forming a second electrode on the organic light emitting layer; and forming an encapsulation layer on the second electrode.

In an exemplary embodiment, forming a color filter layer on a pixel unit may include:

forming a touch control connection electrode on the encapsulation layer, wherein an orthographic projection of the touch control connection electrode on the substrate is within a range of an orthographic projection of the pixel definition layer on the substrate;

forming a first coating protective layer covering the touch control connection electrode on the touch control connection electrode, and forming a via hole exposing the connection electrode on the first coating protective layer;

forming a touch control electrode on the first coating protective layer, wherein the touch control electrode layer is connected with the touch control connection electrode layer through a via hole; and forming color optical filters of different colors, wherein an orthographic projection of the color optical filters on the substrate contains an orthographic projection of the organic light emitting layer on the substrate.

In an exemplary embodiment, the touch control electrode may include a first metal layer and a second metal layer arranged on the first metal layer. An orthographic projection of the second metal layer on the substrate coincides with an orthographic projection of the first metal layer on the substrate, and a reflectivity of the second metal layer is less than a first reflectivity.

In an exemplary embodiment, a material of the second metal layer may be molybdenum oxide (MoOx) or other materials with low reflectivity, a thickness of the second metal layer may be 35 nm to 75 nm, and the first reflectivity may be 17%.

In an exemplary embodiment, a thickness of the touch control electrode may be 300 microns to 400 microns.

In an exemplary embodiment, a thickness of the color filter layer may be 2 microns to 3 microns, a thickness of the touch control connection electrode may be 150 nm to 300 nm, and a thickness of the first coating protective layer may be 1.5 microns to 2.5 microns.

According to the preparation method of the display substrate provided by this embodiment, by arranging the touch control structure layer between the color optical filters of different colors, a BM Mask process and a protective layer coating process are omitted, so that the purposes of cost saving and process simplification are achieved, the distance between the organic light emitting layer and the color filter layer is shortened, the thickness of the display substrate is reduced, the brightness attenuation angle is effectively increased, the power consumption is reduced, the preparation process is simple, the production efficiency is high, having the advantages of low production cost, high yield and the like and a good application prospect.

An embodiment of the present disclosure further provides a display apparatus which includes display substrates of aforementioned embodiments. The display apparatus may be any product or component with a display function such as a mobile phone, a tablet computer, a television, a display, a laptop computer, a digital photo frame, a navigator, etc.

In the description of embodiments of the present disclosure, orientation or positional relationships indicated by terms "middle", "upper", "lower", "front", "back", "vertical", "horizontal", "top", "bottom", "inside", "outside" and the like are based on the orientation or positional relationships shown in the drawings, and are for ease of description of the present disclosure and simplification of the description only, but are not intended to indicate or imply that the mentioned device or element must have a specific orientation, or be constructed and operated in a particular orientation, and therefore they should not be construed as limitation to the present disclosure.

In the description of embodiments of the present disclosure, unless otherwise clearly specified and defined, the terms "install", "connect", "couple" should be broadly interpreted, for example, it may be connected fixedly or connected detachably, or integrated; it may be a mechanical connection or an electrical connection; it may be directly connected, or may be indirectly connected through an intermediary, or may be an internal connection between two elements. Those of ordinary skill in the art can understand the meanings of the above mentioned terms in the present disclosure.

Although the embodiments disclosed in the present disclosure are as described above, the described contents are only the embodiments for facilitating understanding of the present disclosure, which are not intended to limit the present disclosure. Any person skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

What we claim is:

1. A display substrate, comprising: a substrate, multiple pixel units arranged on the substrate and a color filter layer arranged on the pixel unit, wherein:

the color filter layer comprises color optical filters of different colors and a touch control structure layer arranged between the color optical filters of different colors; and the touch control structure layer comprises a touch control connection electrode, a first coating protective layer covering the touch control connection electrode and a touch control electrode arranged on the first coating protective layer, the touch control electrode comprises a first touch control electrode and a second touch control electrode, and at least one of the first touch control electrode and the second touch control electrode is connected with the touch control connection electrode through a via hole penetrating through the first coating protective layer.

2. The display substrate of claim 1, wherein the touch control electrode comprises a first metal layer and a second metal layer arranged on the first metal layer, and an orthographic projection of the first metal layer on the substrate coincides with an orthographic projection of the second metal layer on the substrate.

3. The display substrate of claim 2, wherein the touch control electrode further comprises: a third metal layer, wherein the first metal layer is arranged on the third metal layer, and a manufacturing material of the third metal layer comprises titanium.

4. The display substrate of claim 2, wherein a reflectivity of the second metal layer is less than a first reflectivity, and a manufacturing material of the third metal layer comprises molybdenum oxide.

5. The display substrate of claim 4, wherein the first reflectivity is 17%.

6. The display substrate of claim 1, wherein a thickness of the touch control electrode is 300 nm to 400 nm.

7. The display substrate of claim 2, wherein a thickness of the second metal layer is 35 microns to 70 microns.

8. The display substrate of claim 1, wherein a thickness of the color filter layer is 2 microns to 3 microns.

9. The display substrate of claim 1, wherein a thickness of the touch control connection electrode is 150 nm to 300 nm.

10. The display substrate of claim 1, wherein a thickness of the first coating protective layer is 1.5 microns to 2.5 microns.

11. The display substrate of claim 1, wherein the pixel unit comprises multiple sub-pixels, and each sub-pixel comprises a driving structure layer, a first planarization layer, a first electrode, a pixel definition layer, an organic light emitting layer, a second electrode and an encapsulation layer, wherein:

the driving structure layer is arranged on the substrate, and a driving structure layer in each sub-pixel comprises a first thin film transistor;

the first planarization layer is arranged on the driving structure layer;

the first electrode is arranged on the first planarization layer and connected with the first thin film transistor in the driving structure layer through a via hole formed on the first planarization layer;

the pixel definition layer is arranged on the first planarization layer and comprises multiple pixel openings, and the pixel opening expose the first electrode;

the organic light emitting layer is arranged on the first electrode;

the second electrode is arranged on the organic light emitting layer;

the encapsulation layer is arranged on the second electrode and covers the whole substrate; and the color filter layer is arranged on the encapsulation layer.

12. The display substrate of claim 11, wherein an orthographic projection of the touch control structure layer on the substrate is within a range of an orthographic projection of the pixel definition layer on the substrate.

13. The display substrate of claim 11, wherein an orthographic projection of the color optical filter on the substrate contains an orthographic projection of the organic light emitting layer on the substrate.

14. The display substrate of claim 11, wherein the driving structure layer comprises a buffer layer, an active layer, a first gate insulating layer, a first gate electrode layer, a second gate insulating layer, a second gate electrode layer, a first interlayer insulating layer and a first source and drain metal layer which are layer stacked on the substrate in turn.

15. The display substrate of claim 1, further comprising a second coating protective layer covering the color filter layer and a cover plate arranged above the second coating protective layer.

16. The display substrate of claim 15, wherein a thickness of the second coating protective layer is 1.5 microns to 2.5 microns.

17. A display apparatus, comprising the display substrate of claim 1.

18. A preparation method of a display substrate, comprising:
forming multiple pixel units on a substrate;
forming a color filter layer on the pixel unit, wherein
the color filter layer comprises color optical filters of different colors and a touch control structure layer arranged between the color optical filters of different colors,
the touch control structure layer comprises a touch control connection electrode,
a first coating protective layer covering the touch control connection electrode and a touch control electrode arranged on the first coating protective layer,
the touch control electrode comprises a first touch control electrode and a second touch control electrode, and
at least one of the first touch control electrode and the second touch control electrode is connected with the touch control connection electrode through a via hole penetrating through the first coating protective layer.

19. The method of claim 18, wherein the forming multiple pixel units on the substrate comprises:
forming a driving structure layer on the substrate;
forming a first planarization layer on the driving structure layer;
forming a first electrode and a pixel definition layer on the first planarization layer;
forming an organic light emitting layer on the pixel definition layer;
forming a second electrode on the organic light emitting layer; and
forming an encapsulation layer on the second electrode.

20. The method of claim 19, wherein, forming the color filter layer on the pixel unit comprises:
forming a touch control connection electrode on the encapsulation layer, wherein an orthographic projection of the touch control connection electrode on the substrate is within a range of an orthographic projection of the pixel definition layer on the substrate;
forming a first coating protective layer covering the touch control connection electrode, and forming a via hole exposing the touch control connection electrode on the first coating protective layer;
forming a touch control electrode on the first coating protective layer, wherein the touch control electrode is connected with the touch control connection electrode layer through a via hole; and
forming color optical filters of different colors, wherein an orthographic projection of the color optical filter on the substrate contains an orthographic projection of the organic light emitting layer on the substrate.

* * * * *